United States Patent [19]

Kaim et al.

[11] Patent Number: 5,595,784
[45] Date of Patent: Jan. 21, 1997

[54] TITANIUM NITRIDE AND MULTILAYERS FORMED BY CHEMICAL VAPOR DEPOSITION OF TITANIUM HALIDES

[76] Inventors: Robert Kaim, 762 Washington St., Brookline, Mass. 02146; John W. Vanderpot, 29 Pearl Rd., Boxford, Mass. 01921

[21] Appl. No.: 516,790

[22] Filed: Aug. 18, 1995

Related U.S. Application Data

[63] Continuation-in-part of Ser. No. 509,856, Aug. 1, 1995.

[51] Int. Cl.$^6$ .............................. C23C 16/00; B05D 3/06
[52] U.S. Cl. ........................... 427/255.2; 427/255.1; 427/255; 427/255.7; 427/253; 427/569; 427/419.7
[58] Field of Search ................ 427/255.2, 255.1, 427/253, 569, 250, 255.7, 255, 419.7

[56] References Cited

U.S. PATENT DOCUMENTS

| | | | |
|---|---|---|---|
| 4,977,106 | 12/1990 | Smith | 437/192 |
| 5,273,588 | 12/1993 | Foster et al. | 118/723 |
| 5,399,379 | 3/1995 | Sandhu | 427/255.2 |

FOREIGN PATENT DOCUMENTS 3-214734  9/1991  Japan .

OTHER PUBLICATIONS

Pierson, "Handbook of Chemical Vapor Deposition (CVD), Principles, Technology and Applications," (1992) pp. 246–247.

Akahori et al., "TiN/Ti Films Formation Using ECR Plasma CVD" Jun. 8–9, 1993 VMIC Conference 1993 ISMIC–102/93/0405.

Goldberg et al., "Low temperature in-situ sequential chemical vapor deposition of Ti/TiN ultrathin bilayers for ULSI barrier applications" Conference Paper from Advanced Metalization for ULSI Applications (1994).

*Primary Examiner*—Roy V. King
*Attorney, Agent, or Firm*—Curtis A. Vock

[57] ABSTRACT

A gaseous mixture of a titanium halide and silane is introduced to a plasma or thermal CVD reactor to induce a reaction such that a conformal and pure titanium film is deposited onto a semiconductor device within the reactor. The titanium halide has a chemical form of $TiX_4$, where X is a halogen. Other gaseous combinations of the titanium halide, ammonia, hydrogen, a halogen and silane are subjected to plasma or thermal CVD to induce a reaction to deposit titanium silicide and titanium nitride films onto the semiconductor device. Successive CVD processes create bilayers of $TiSi_x$/TiN or Ti/TiN, and/or trilayers of $TiSi_x$/Ti/TiN onto the semiconductor device.

14 Claims, 6 Drawing Sheets

5,595,784

TITANIUM NITRIDE AND MULTILAYERS FORMED BY CHEMICAL VAPOR DEPOSITION OF TITANIUM HALIDES

RELATED APPLICATIONS

This is a continuation-in-part of U.S. patent application Ser. No. 08/509,856, entitled "Titanium and Titanium Silicide Films formed by Chemical Vapor Deposition of Titanium Halides and Silane," filed on Aug. 1, 1995, and which is expressly incorporated herein by reference.

BACKGROUND OF THE INVENTION

Titanium (Ti) films are widely used in conjunction with titanium-nitride (TiN) as adhesion and barrier layers for the metallization of integrated circuits (ICs). These films are desirable because of several favorable characteristics, including electrical conductivity, corrosion resistance, strength under temperature stresses, and stability.

Ti films are particularly important to microelectronics technology in obtaining low contact resistance to the underlying silicon device. Typically, this is achieved by reacting titanium with silicon to form low-resistance titanium silicide. TiN films are used as a barrier layer between the metallization and the underlying silicon.

With the ever-increasing complexity and reduced feature-size of ICs, there is a growing need to reliably deposit Ti and TiN layers at the bottom of deep narrow contact holes or vias. In the prior art, Ti and TiN films have been deposited by physical vapor deposition or sputtering techniques. However, such techniques are inadequate for high density ICs because of non-conformal coverage of the deep holes.

Conformality of Ti and TiN films in deep holes has improved with the use of chemical vapor deposition (CVD). By way of example, Japan patent number 3214734 describes TiN film formation by CVD using titanium tetrabromide and nitrogen gases. The prior art has also described the CVD formation of Ti and TiN layers from tetraiodotitanium ($TiI_4$), and from titanium tetrachloride ($TiCl_4$). The prior art has also shown that the formation rate of titanium films increases by utilizing plasma enhanced CVD.

Nevertheless, the formation of Ti and titanium silicide films according to the prior art leads to several problems. First, even with plasma enhancement—using the gases taught in the prior art, specifically, hydrogen, argon and titanium halide—the required plasma reaction temperature is still too high, encouraging unwanted diffusion, and risking damage to existing metallization layers. Secondly, titanium films made from titanium halides typically contain too much residual halogen, increasing the risk of corrosion of the metallization layers, and reducing the IC's reliability. Third, silicide formation subsequent to titanium deposition requires balancing between the consumption of surface silicon and deposited titanium.

Accordingly, titanium and titanium nitride bilayers (Ti/TiN), titanium silicide and titanium nitride bilayers ($TiSi_x$/TiN), and trilayers of titanium, titanium silicide and titanium nitride ($TiSi_x$/Ti/TiN) are also problematic when manufactured by the teachings of the prior art.

The prior art has also shown that certain difficulties exist in the manufacture of TiN films by CVD. For example, U.S. Pat. No. 4,977,106, entitled "TiN Chemical Vapor Deposition Using $TiCl_4$ and $SiH_4$," describes the desirability of forming TiN film by CVD and with higher deposition rates and lower reactor temperatures.

It is, accordingly, one object of the invention to provide processes of forming titanium and titanium silicide bi- and tri-layer films with titanium nitride which reduce the aforementioned difficulties.

Another object of the invention is to provide an improved process for generating TiN films by CVD.

These and other objects of the invention will be apparent from the description which follows.

SUMMARY OF THE INVENTION

In one aspect, the invention provides for a chemical vapor deposition process of depositing titanium nitride film onto a semiconductor device. The process includes the steps of (1) forming a gaseous mixture which includes titanium halide, silane, and ammonia, and (2) transforming the mixture within a chemical vapor deposition reactor to deposit the titanium nitride film onto the semiconductor device. In accord with this aspect, the titanium halide is either titanium iodide or titanium bromide. The process preferably utilizes either plasma chemical vapor deposition or thermal chemical vapor deposition, and the silane is preferably one of $SiH_4$, $Si_2H_6$, or $Si_3H_8$. A further feature of the process can include the step of adding an inert gas as a carrier or plasma support gas.

In another aspect, the invention provides a chemical vapor deposition process of depositing titanium nitride film onto a semiconductor device, including the steps of (1) forming a gaseous mixture including titanium halide, silane, a halogen, and ammonia, and (2) transforming the mixture within a chemical vapor deposition reactor to deposit the titanium nitride film onto the semiconductor device. The titanium halide of this aspect is one of titanium iodide, titanium bromide and titanium chloride, while the halogen is one of chlorine, iodine and bromine.

In yet another aspect, a chemical vapor deposition process is provided for depositing titanium nitride film onto a semiconductor device, including the steps of (1) forming a gaseous mixture including titanium halide, a halogen, and ammonia, and (2) transforming the mixture within a chemical vapor deposition reactor to deposit the titanium nitride film onto the semiconductor device. In this aspect, the titanium halide is one of titanium iodide, titanium bromide and titanium chloride, and the halogen is one of chlorine, iodine and bromine.

The invention also provides, in other aspects, titanium nitride films formed onto a semiconductor device by any of the following reactions: $2TiX_4 + 2SiH_4 + 2NH_3$ into $2TiN + 2SiX_4 + 7H_2$, where X is either bromine or iodine; $2TiX_4 + 4NH_3 + 2X_2$ into $2TiN + N_2 + 12HX$, where X is one of chlorine, bromine and iodine; $2TiX_4 + 3X_2 + 2NH_3 + SiH_4$ into $2TiN + 10HX + SiX_4$, where X is one of chlorine, bromine and iodine; $2TiX_4 + 4NH_3 + 2Y_2$ into $2TiN + 8HX + 4HY + N_2$, where X and Y are halogens (chlorine, bromine or iodine) and n is 0,1,2,3 or 4; and $2TiX_4 + 3Y_2 + 2NH_3 + SiH_4$ into $2TiN + SiY_nX_{4-n} + (4+n)HX + (6-n)HY$, where X and Y are halogens (chlorine, bromine or iodine) and n is 0,1,2,3 or 4.

In still another aspect, the invention provides a chemical vapor deposition process of depositing a bilayer of titanium silicide and titanium nitride onto a semiconductor device, including the steps of (i) forming a first gaseous mixture including titanium halide and a first gas that includes silane, (ii) transforming the mixture by chemical vapor deposition to deposit the titanium silicide film onto the semiconductor device, (iii) forming a second gaseous mixture including titanium halide, ammonia, and the first gas, and (iv) transforming the second mixture by chemical vapor deposition to deposit a titanium nitride film onto the semiconductor device. In this manner, a bilayer of titanium silicide and titanium nitride is formed. Preferably, in this aspect, the reactions occur through plasma or thermal chemical vapor deposition; the silane is one of $SiH_4$, $Si_2H_6$, and $Si_3H_8$; and the titanium halide has the chemical form of $TiX_4$, where X is one of chlorine, bromine and iodine. An inert gas such as Argon can be added to the mixture as a carrier or plasma support gas.

In another aspect, a chemical vapor deposition process is provided for depositing a trilayer of titanium silicide, titanium, and titanium nitride onto a semiconductor device, including the steps of (i) forming a first gaseous mixture including titanium halide and a first gas that includes silane, (ii) transforming the mixture by chemical vapor deposition to deposit the titanium silicide film onto the semiconductor device, (iii) forming a second gaseous mixture including titanium halide and the first gas, (iv) transforming the mixture by chemical vapor deposition to deposit the titanium film onto the semiconductor device, (v) forming a third gaseous mixture including titanium halide, ammonia, and the first gas, and (vi) transforming the third mixture by chemical vapor deposition to deposit a titanium nitride film onto the semiconductor device. In this manner, a trilayer of titanium silicide, titanium and titanium nitride is formed. Preferably, in this aspect, the reactions occur through plasma or thermal chemical vapor deposition; the silane is one of $SiH_4$, $Si_2H_6$, and $Si_3H_8$; and the titanium halide has the chemical form of $TiX_4$, where X is one of chlorine, bromine and iodine. An inert gas such as Argon can be added to the mixture as a carrier or plasma support gas.

In still another aspect, the invention provides chemical vapor deposition process of depositing a bilayer of titanium and titanium nitride onto a semiconductor device, including the steps of (i) forming a first gaseous mixture including titanium halide and a first gas that includes silane, (ii) transforming the mixture by chemical vapor deposition to deposit the titanium film onto the semiconductor device, (iii) forming a second gaseous mixture including titanium halide, ammonia, and the first gas, and (iv) transforming the second mixture by chemical vapor deposition to deposit a titanium nitride film onto the semiconductor device. In this manner, a bilayer of titanium and titanium nitride is formed These and other aspects and advantages of the invention are evident in the description which follows and in the accompanying drawings.

DETAILED DESCRIPTION OF THE INVENTION

Figure 1:
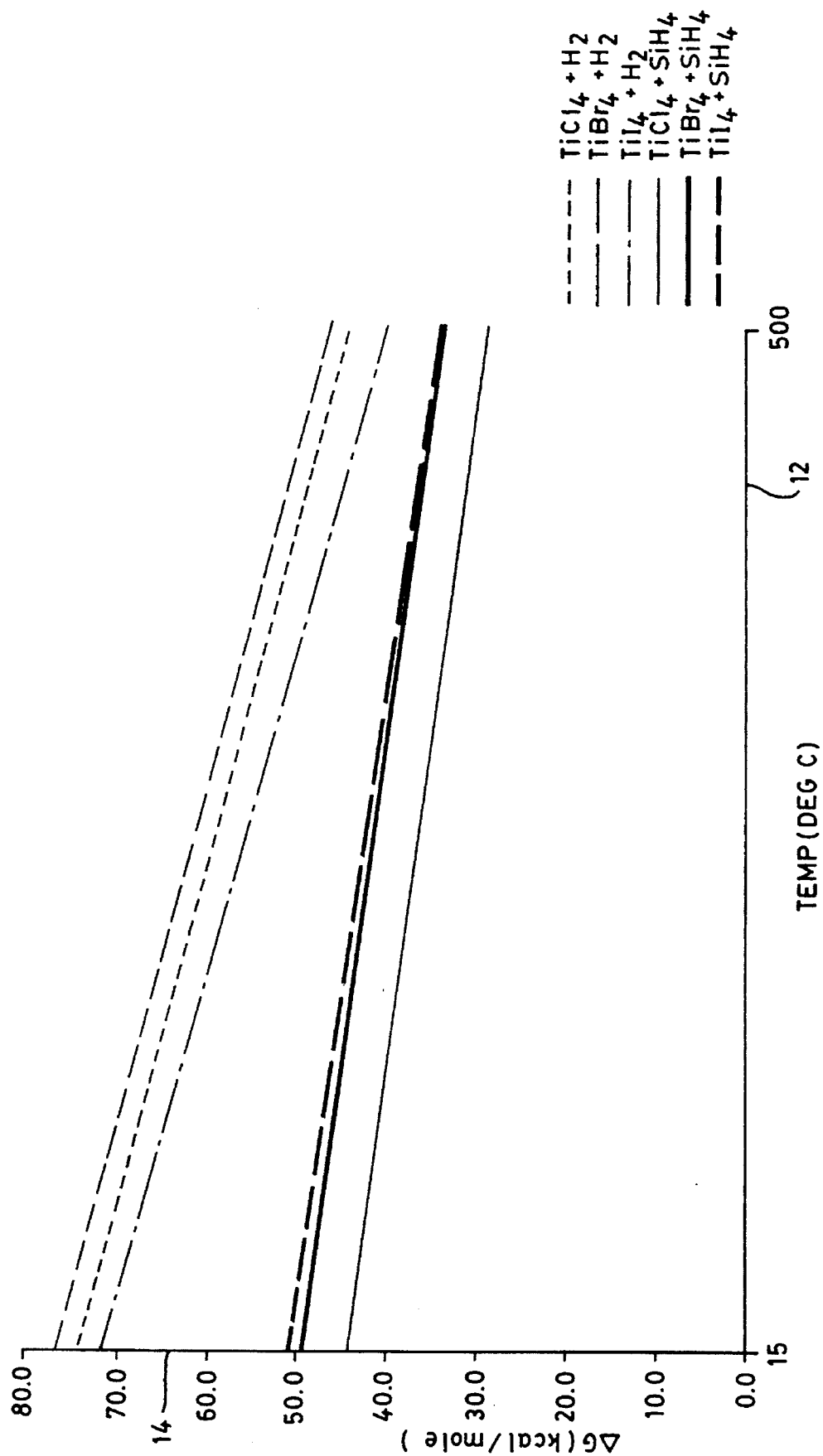
FIG. 1a graphically illustrates a free energy diagram for titanium films produced by CVD of titanium halides and silane, in accord with the invention, and additionally shows free energy data for those titanium films produced by titanium halides and hydrogen.
FIG. 1b graphically illustrates a free energy diagram for titanium films produced by CVD of titanium halides with silane and a halogen, in accord with the invention, and additionally shows free energy data for those titanium films produced by titanium halides and hydrogen.

The present invention concerns the deposition of titanium, titanium silicide, and titanium nitride films by thermal and plasma CVD of titanium halides and silane. CVD reactors suitable for use with the invention are known in the art. For example, U.S. Pat. No. 5,273,588, entitled "Semiconductor wafer processing CVD reactor apparatus comprising contoured electrode gas directing means," describes useful background in connection with a plasma CVD reactor that is suitable for use with the invention, and is accordingly incorporated herein by reference. Similarly, U.S. Pat. No. 5,399,379, entitled "Low-pressure chemical vapor deposition process for depositing high-density, highly-conformal titanium nitride films of low bulk resistivity," describes additional background in connection with a thermal CVD reactor suitable for use with the invention, and is accordingly incorporated herein by reference.

Other useful background relative to the invention include the following patents and articles, each of which is hereby incorporated by reference: U.S. Pat. No. 4,977,106;, Japan patent number 3214734; M. S. Ameen et al., *Characterization of Titanium Films Deposited by Plasma-Enhanced Chemical Vapor Deposition*, Materials Research Society Proceedings (Oct. 4–6, 1994); Takashi Akahori et al., *TiN/Ti Films Formation Using ECR Plasma CVD*, Proceedings Tenth International VLSI Multilevel Interconnection Conference (Jun. 8–9, 1993).

In accord with the invention, a Ti/TiN bilayer, a $TiSi_x$/TiN bilayer or a $TiSi_x$/Ti/TiN trilayer is formed onto a semiconductor device. These layers can be formed successively within one CVD reactor, or within a plurality of reactors, depending upon production or manufacturing convenience. The three distinct CVD processes used to generate any of the individual films of these layers—and in any order—are described below:

1. Titanium Film

For the titanium film, a gaseous mixture of (i) titanium halide and silane or (ii) titanium halide, a halogen and silane is introduced to a plasma or thermal CVD reactor to induce a reaction such that a titanium film is deposited onto a semiconductor device within the reactor. The titanium halide of the mixture has a chemical form of $TiX_4$, where X is a halogen (chlorine, bromine or iodine). The silanes of this mixture can include one of the following chemical forms: $SiH_4$, $Si_2H_6$ (disilane), and $Si_3H_8$ (trisilane).

When titanium film is deposited in this manner, the film is highly conformal and pure. The specific reactions which form the titanium film include the following:

| # | Gaseous Mixture (pre-CVD) | CVD Reaction | Film and Residuals (post-CVD) |
|---|---|---|---|
| 1 | $2TiX_4 + SiH_4$ | → | $2Ti + SiX_4 + 4HX$ |
| 2 | $TiX_4 + SiH_4 + 2X_2$ | → | $Ti + SiX_4\ 4HX$ |
| 3 | $TiX_4 + SiH_4 + 2Y_2$ | → | $SiY_nX_{4-n} + nHX + (4 - n)HY + Ti$ | where X and Y are halogens (chlorine, bromine or iodine)
where n = 0, 1, 2, 3 or 4

Typical CVD reactor conditions which are compatible with the Ti film-deposition process according to the invention include the following general parameters of reactor temperature and pressure, and flow rates:

| | |
|---|---|
| Temperature: | 375 to 600 degrees C. |
| Pressure: | 0.1 to 20 Torr |
| Flow Rates: | $TiX_4$ - 5 to 100 sccm |
| | $SiH_4$ - 20 to 500 sccm |
| | $X_2$ - 0 to 100 sccm |
| | Ar (or other inert gases) - 0 to 1000 sccm |

Certain advantages are apparent with reference to the reactions listed above. In reaction #1 and #2, for example, $SiX_4$ has a large negative heat of formation as compared to HX, and thus acts as a scavenger for X. In the case of the $TiX_4$ and hydrogen reaction of the prior art, the halogen X is removed only as HX; and thus the use of silane, in accord with the invention, leads to purer films, lower content of X in the film, and fewer problems with corrosion.

In accord with the invention, several other advantages are realized. First, silane reaction is thermodynamically favorable as compared to the use of hydrogen as a reactant. More particularly, reactions with silane proceed at lower temperatures so that the reaction rate is higher at typical CVD operating temperatures.

2. Titanium Silicide Film

For the titanium silicide film, a gaseous mixture of titanium halide and silane is introduced to the plasma or thermal CVD reactor to induce a reaction such that a titanium silicide film is deposited onto the semiconductor device. The titanium halide for this film has the chemical form of $TiX_4$, where X is a halogen (chlorine, bromine or iodine). The silanes for this film include the chemical forms of $SiH_4$, $Si_2H_6$ (disilane), $Si_3H_8$ (trisilane).

As above, when a titanium silicide film is deposited in this manner, the film is highly conformal and pure. Several reactions satisfy this titanium silicide film deposition, including:

| # | Gaseous Mixture (pre-CVD) | CVD Reaction | Film and Residuals (post-CVD) |
|---|---|---|---|
| 4 | $TiX_4 + 2SiH_4$ | → | $TiSi_2 + 4HX + 2H_2$ |
| 5 | $TiX_4 + \alpha SiH_4$ | → | $TiSi_\alpha + 4HX + 2(\alpha - 1)H_2$ |
| 6 | $TiX_4 + \beta SiH_4 + 2(1 - \beta)H_2$ | → | $TiSi_\beta\ 4HX$ | where X is a halogen such as chlorine, bromine, and iodine,
where α is a real number between 1 and 2, and
where β is a real number between 0 and 1

In the case of the mixture $TiX_4+\beta SiH_4+2(1-\beta)H_2$, hydrogen is included as a reactant to reduce the silicon content in the resulting titanium silicide layer.

Typical CVD reactor conditions which are compatible with the $TiSi_x$ film-deposition process according to the invention include the following general parameters of reactor temperature and pressure, and flow rates:

| | |
|---|---|
| Temperature: | 375 to 600 degrees C. |
| Pressure: | 0.1 to 20 Torr |
| Flow Rates: | $TiX_4$ - 5 to 100 sccm |
| | $SiH_4$ - 20 to 500 sccm |
| | $X_2$ - 0 to 100 sccm |
| | $H_2$ - 0 to 100 sccm |
| | Ar (or other inert gases) - 0 to 1000 sccm |

3. Titanium Nitride

For the titanium nitride film, a gaseous mixture including titanium halide and ammonia is introduced to the plasma or thermal CVD reactor to induce a reaction such that a titanium nitride film is deposited onto the semiconductor device. The titanium halide for this film has the chemical form of $TiX_4$, where X is a halogen (chlorine, bromine or iodine). The silanes for this film include the chemical forms of $SiH_4$, $Si_2H_6$ (disilane), $Si_3H_8$ (trisilane). Ammonia has the chemical form of $NH_3$. In accord with the invention, the gaseous mixture preferably includes silane; and most preferably includes silane and a halogen.

Several reactions satisfy this titanium nitride film deposition, including:

| # | Gaseous Mixture (pre-CVD) | CVD Reaction | Film and Residuals (post-CVD) |
|---|---|---|---|
| 7 | $2TiX_4 + 2NH_3 + 2SiH_4$ | → | $2TiN + 2SiX_4 + 7H_2$ |
| 8 | $6TiX_4 + 8NH_3$ | → | $6TiN + N_2 + 24HX$ |
| 9 | $2TiX_4 + 4NH_3 + 2X_2$ | → | $2TiN + 12HX + N_2$ |
| 10 | $2TiX_4 + 3X_2 + 2NH_3 + SiH_4$ | → | $2TiN + 10HX + SiX_4$ |
| 11 | $2TiX_4 + 4NH_3 + 2Y_2$ | → | $2TiN + 8HX + 4HY + N_2$ |
| 12 | $2TiX_4 + 3Y_2 + 2NH_3 + SiH_4$ | → | $2TiN + SiY_nX_{4-n} + (4 + n)HX + (6 - n)HY$ | where X and Y are halogens (chlorine, bromine or iodine)
where n = 0, 1, 2, 3 or 4

Typical CVD reactor conditions which are compatible with the TiN film-deposition process according to the invention include the following general parameters of reactor temperature and pressure, and flow rates:

| | |
|---|---|
| Temperature: | 375 to 600 degrees C. |
| Pressure: | 0.1 to 20 Torr |
| Flow Rates: | $TiX_4$ - 5 to 100 sccm |
| | $SiH_4$ - 20 to 500 sccm |
| | $X_2$ - 0 to 100 sccm |
| | $H_2$ - 0 to 100 sccm |
| | NH3 - 100 to 500 sccm |
| | Ar (or other inert gases) - 0 to 1000 sccm |

Figure 1B:
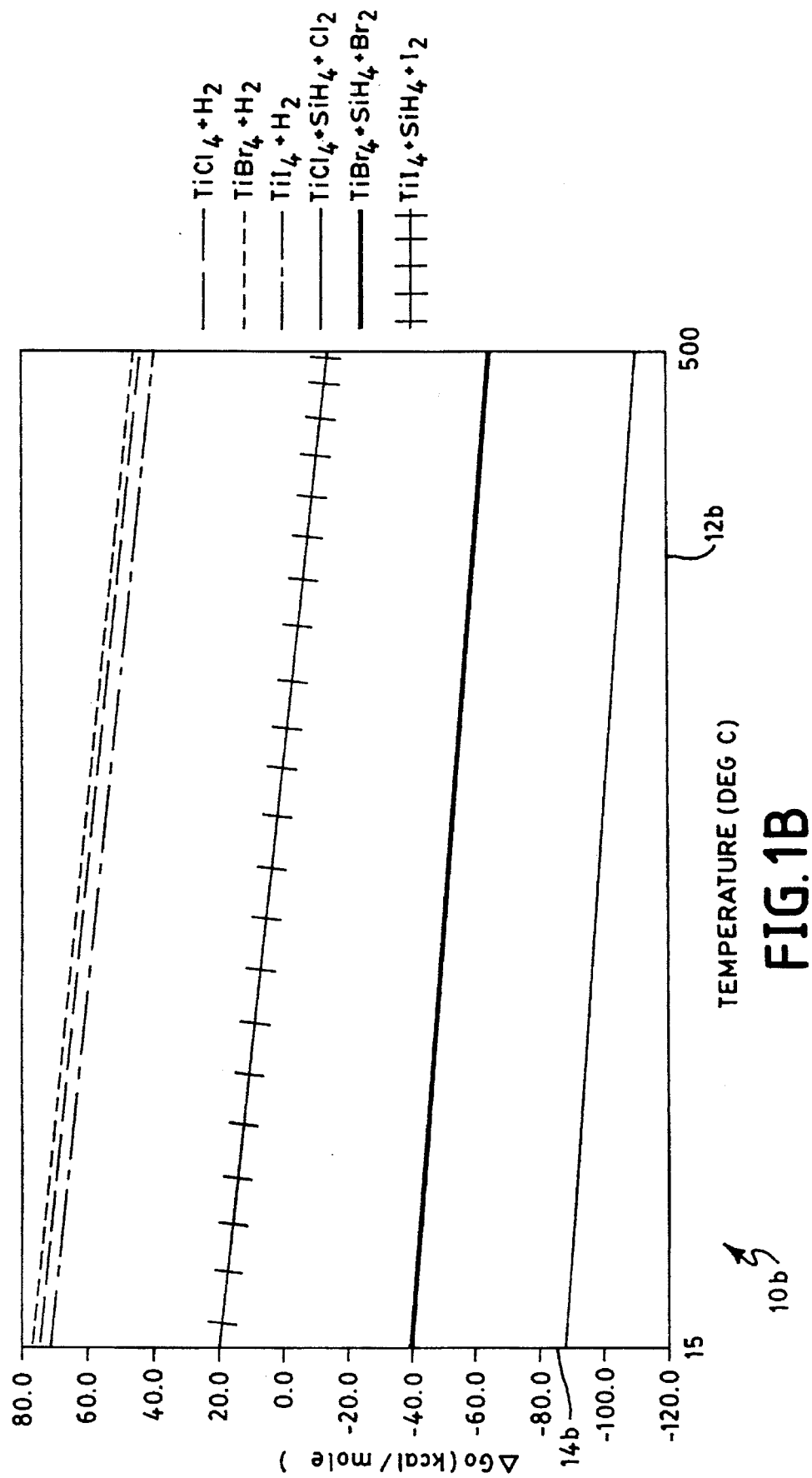

FIG. 1a shows a graph 10 of the free energy change for the chemical reactions of $TiX_4$ with silane and hydrogen. The "x" axis 12 of FIG. 1 represents temperature in degrees Centigrade; while the "y" axis 14 represents $\Delta G_o$ in kilocalories per mole. It is clear from FIG. 1 that the thermodynamic reactions of silane are favorably lower in $\Delta G_o$ as compared to the similar reactions of hydrogen at the same temperature. FIG. 1b shows a related graph 10b of the free energy change for the chemical reactions of $TiX_4$ with hydrogen, and with silane and a halogen. The "x" axis 12b of FIG. 1b represents temperature in degrees Centigrade;

while the "y" axis 14b represents $\Delta G_o$ in kilocalories per mole.

Figure 2:
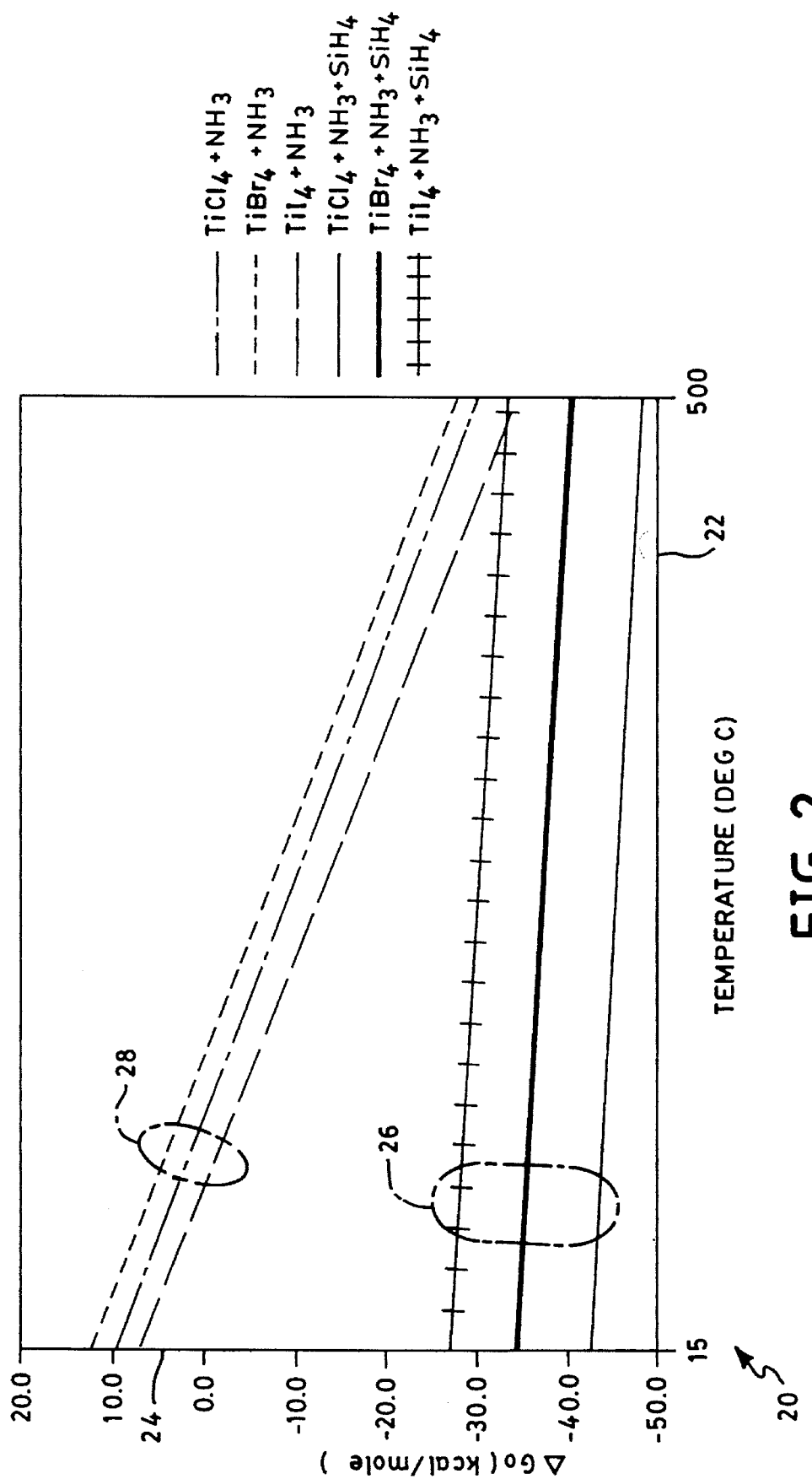
FIG. 2 graphically illustrates a free energy diagram for titanium nitride films produced by CVD of titanium halides, ammonia and silane, in accord with the invention, and additionally shows free energy data for those titanium nitride films produced by titanium halides and ammonia without silane.

FIG. 2 shows a similar graph 20 of the free energy change for TiN formed with titanium halides and with and without silane as a reactant. As above, the "x" axis 22 of FIG. 2 represents temperature in degrees Centigrade; while the "y" axis 24 represents $\Delta G_o$ in kilocalories per mole. As apparent with reference to FIG. 2, the titanium halide and ammonia reactions with silane, i.e., the data 26, are favorably lower than the related reactions without silane, i.e., the data 28.

It should be noted that the thermodynamic data shown in FIGS. 1 and 2 derive from "steady-state" calculations. For example, the data 26, 28 represent thermodynamic solutions within a closed CVD reactor. It is thus a mathematical approximation for the very complex reactions within the reactor. In reality, the reactions within the CVD reactor never reach "steady state" because gases are continually injected to within the reactor, and products of the reaction are continually withdrawn through exhaust ducts.

Figure 3:
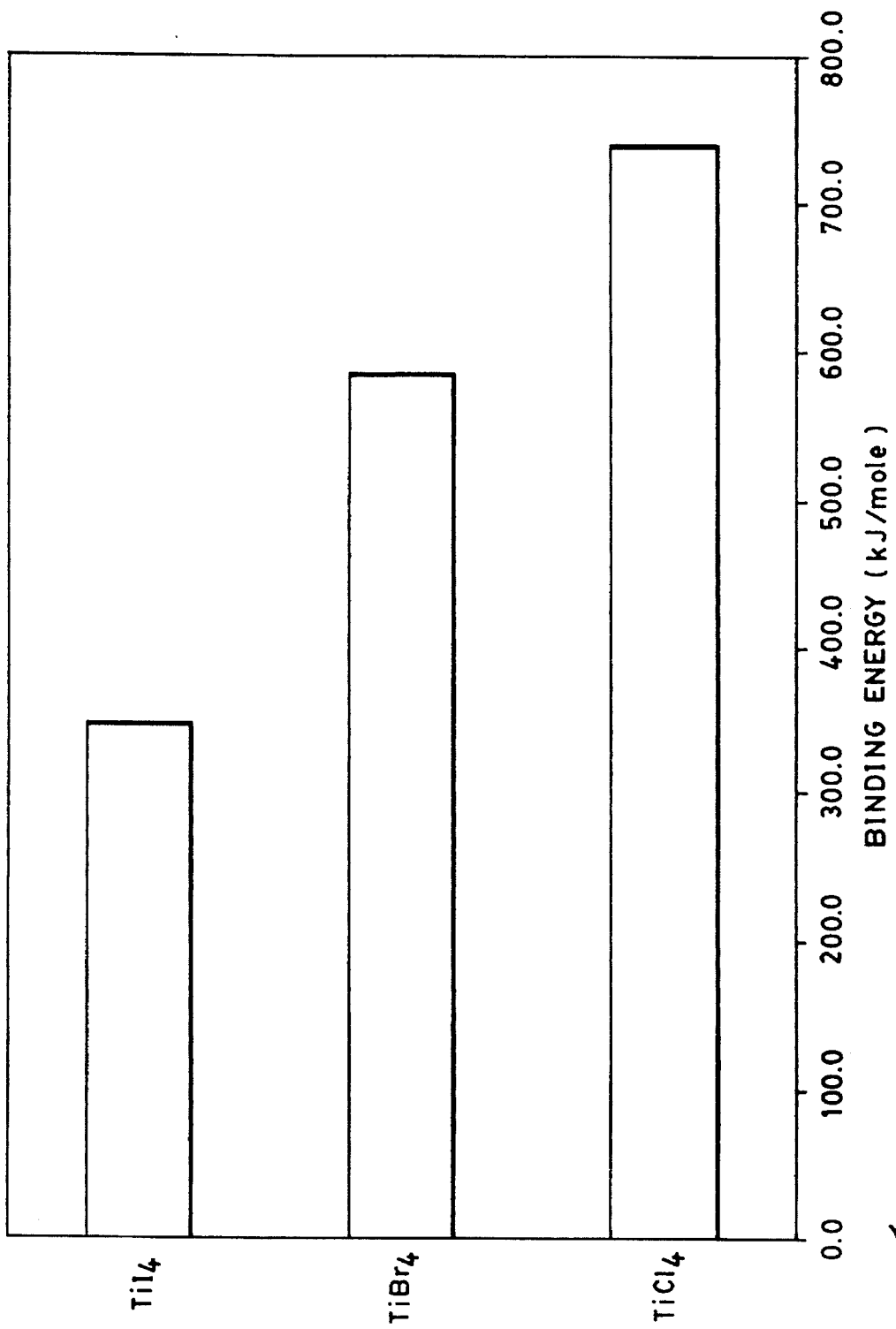
FIG. 3 shows a graph illustrating the binding energies of titanium iodide, titanium bromide and titanium chloride.

This dynamic process within the CVD reactor is extremely difficult to evaluate, and the authors of the prior art have developed various models which produce differing results. Nevertheless, one important measure of the reactions within the CVD reactor is the binding energy of the reactants. While the thermodynamic differences between the data 26 and 28 of FIG. 2 are significant, the relatively minor thermodynamic differences between the reactions of the data 26 are difficult to assess in a meaningful way because of the "steady state" nature of the calculations of FIG. 2. FIG. 3 therefore shows a graph 30 of the binding energies of three reactants represented in the data 26.

The prior art of Smith, U.S. Pat. No. 4,977,106, has described the advantages of forming TiN films by CVD of silane, titanium chloride and ammonia. According to Smith, these advantages include improved deposition rates and lower reactor temperatures and occur because of a larger free energy change in the reaction. With reference to FIG. 3, it is clear that titanium iodide and titanium bromide have lower binding energies as compared to titanium chloride.

Accordingly, one preferred embodiment of the invention is to form TiN through CVD of $TiX_4$, where X is the halide of iodine or bromine, combined with ammonia and silane. It is believed that the lower binding energies of these reactants can cause the reaction to proceed at lower temperatures, as compared to the chloride, and can also reduce the halogen content of the TiN film, providing other advantages over the prior art, such as Smith.

Figure 4:
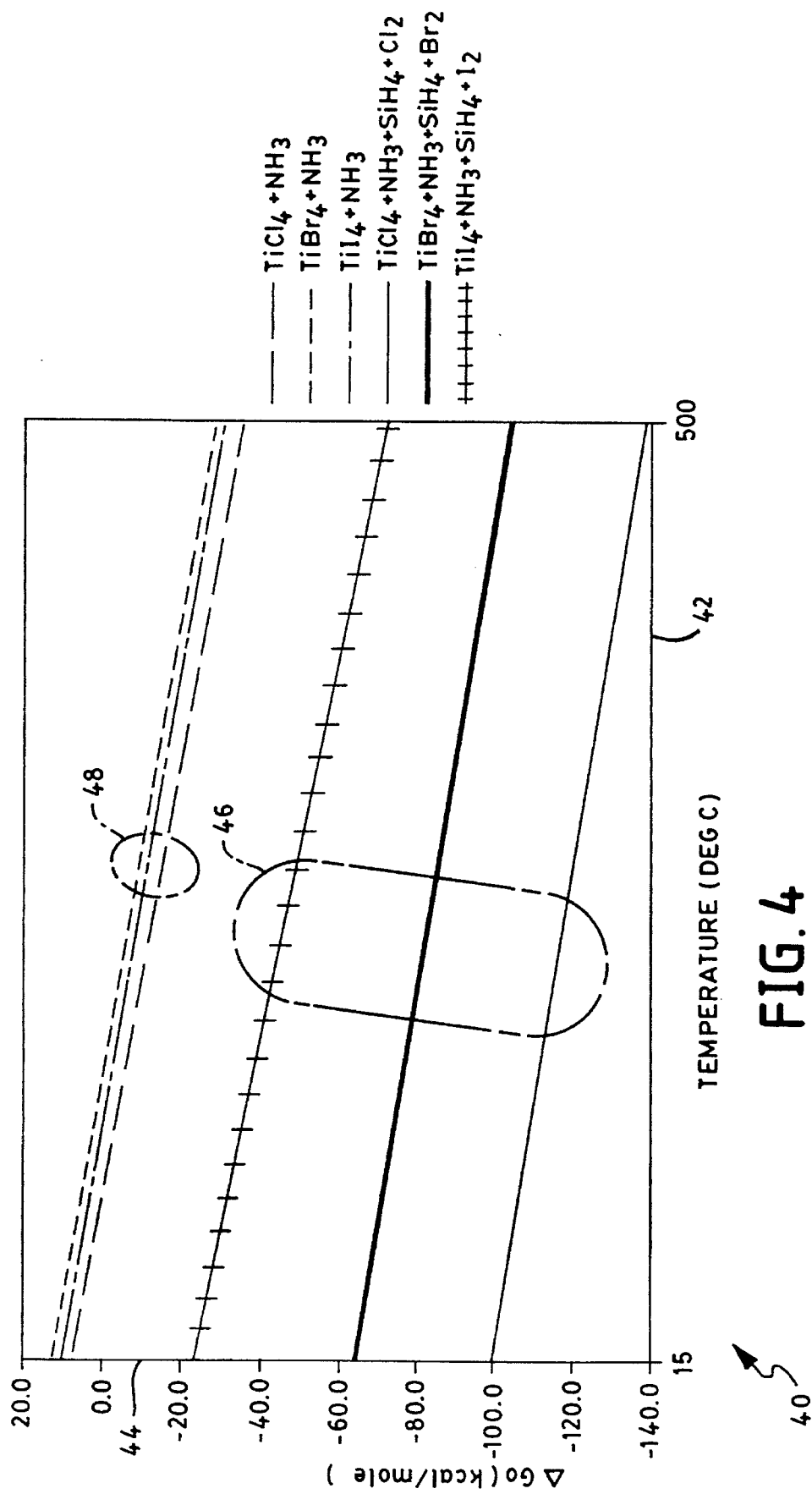
FIG. 4 graphically illustrates a free energy diagram for titanium nitride films produced by CVD of titanium halides, silane, ammonia and a halogen, in accord with the invention, and additionally shows free energy data for those titanium nitride films produced by titanium halides and ammonia.

A more preferred embodiment of the invention is to add a halogen to the gaseous mixture which forms this TiN film. In particular, by forming a gaseous mixture of $TiX_4$, ammonia, a halogen, and silane, where X is the halide of iodine, bromine or chlorine, a more favorable thermodynamic solution is obtained as compared to the data 26 of FIG. 2. FIG. 4 shows a graph 40 of the free energy change for TiN formed with titanium halides and ammonia and with and without silane and halogens as reactants. The "x" axis 42 of FIG. 4 represents temperature in degrees Centigrade; while the "y" axis 44 represents $\Delta G_o$ in kilocalories per mole. As apparent with reference to FIG. 4, the titanium halide, ammonia, silane and halogen reactions, i.e., the data 46, are favorably lower than the related reactions without silane and the halogens, i.e., the data 48 (note that data 48 is the same as data 28 of FIG. 2). By comparing the data 26 of FIG. 2 with the data 46, it is also clear that the thermodynamic solution which includes a halogen—i.e., the data 46—provides a more favorable CVD environment.

Figure 5:
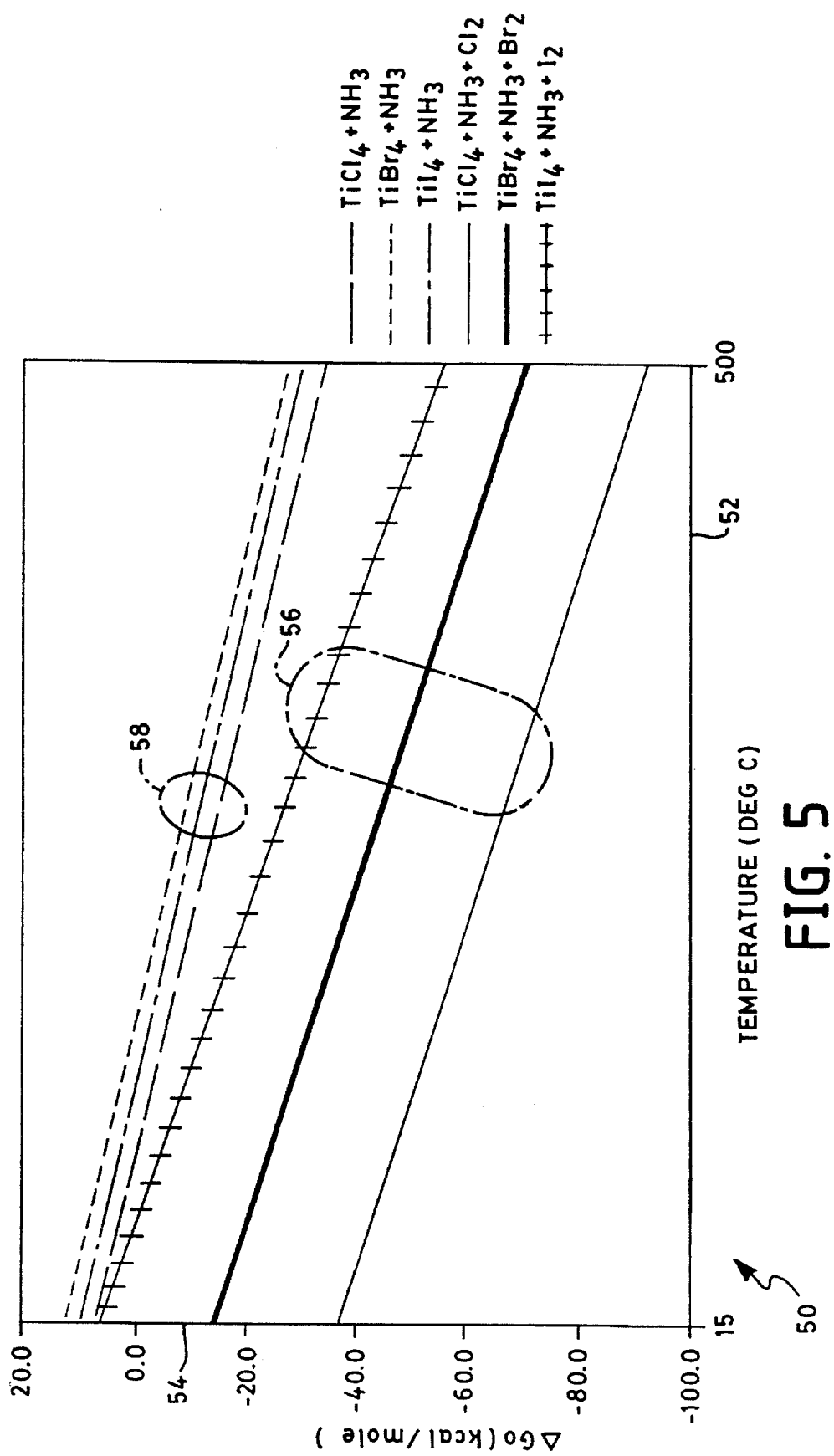
FIG. 5 graphically illustrates a free energy diagram for titanium nitride films produced by CVD of titanium halides, ammonia and a halogen, in accord with the invention, and additionally shows free energy data for those titanium nitride films produced by titanium halides and ammonia.

FIG. 5 shows a graph 50 of the free energy change for TiN formed with titanium halides and ammonia and with and without a halogen as a reactant. The "x" axis 52 of FIG. 5 represents temperature in degrees Centigrade; while the "y" axis 54 represents $\Delta G_o$ in kilocalories per mole. With reference to the data within FIG. 5, the titanium halide, ammonia and halogen reactions, i.e., the data 56, are favorably lower than the related reactions without the halogen, i.e., the data 58 (note that data 58 is the same as data 28 of FIG. 2). Therefore, TiN film formation can be made in a favorable thermodynamic environment by CVD of titanium halides, ammonia and a halogen. Although the free energy change of the reactions represented in the data 56 can be higher (depending upon the halogen) than that of the related reactions which include silane, e.g., data 26 of FIG. 2 and data 46 of FIG. 4, a gaseous mixture without silane is preferred when a silicon-free film is desired. The prior art has not taught the use of a halogen as a free reactant for TiN film formation.

The invention thus enables the deposition of silicides, silicide-containing titanium films, and pure titanium films depending on deposition conditions. In combination with CVD TiN films, the invention thus enables the formation of Ti/TiN bilayer films, $TiSi_x$/TiN bilayer films, and $TiSi_x$/Ti/TiN trilayer films, where the silicide forms the contact, the titanium layer acts as an adhesive, and the titanium nitride layer is a diffusion barrier.

Finally, the invention provides for improved deposition of TiN films utilizing (i) titanium iodide, titanium bromide and titanium chloride with silane and a halogen, (ii) titanium iodide and titanium bromide with silane, and (iii) titanium iodide, titanium bromide and titanium chloride with a halogen.

Those skilled in the art shall appreciate that other silanes are suitable for use with the invention. For example, disilane ($Si_2H_4$) and trisilane ($Si_3H_8$) can be used to form titanium, titanium silicide, and titanium nitride films in accord with the invention. In addition, it should be clear that the titanium halide, silane and halogen described in connection with the invention are reactants, and that any other inert gases—such as the noble gases of Argon and Helium—can be added as a carrier or as a plasma support gas. The carrier gases are used for example to carry in substances which have lower vapor pressures; while plasma support gases are often used to encourage plasma ignition.

The invention thus attains the objects set forth above, among those apparent from preceding description. Since certain changes may be made in the above apparatus and methods without departing from the scope of the invention, it is intended that all matter contained in the above description or shown in the accompanying drawing be interpreted as illustrative and not in a limiting sense.

It is also to be understood that the following claims are to cover all generic and specific features of the invention described herein, and all statements of the scope of the invention which, as a matter of language, might be said to fall there between.

Having described the invention, what is claimed as new and secured by Letters Patent is:

1. A chemical vapor deposition process of depositing a titanium nitride film onto a semiconductor device, comprising the steps of forming a gaseous mixture including titanium halide, silane, a halogen, and ammonia, and transforming the mixture within a chemical vapor deposition reactor to deposit the titanium nitride film onto the semiconductor device, the titanium halide being selected from the group consisting of titanium iodide, titanium bromide and titanium chloride, the halogen being selected from the group consisting of chlorine, iodine and bromine.

2. A chemical vapor deposition process of depositing a titanium nitride film onto a semiconductor device, comprising the steps of forming a gaseous mixture including titanium halide, a halogen, and ammonia, and transforming the mixture within a chemical vapor deposition reactor to deposit the titanium nitride film onto the semiconductor device, the titanium halide being selected from the group consisting of titanium iodide, titanium bromide and titanium chloride, the halogen being selected from the group consisting of chlorine, iodine and bromine.

3. A chemical vapor deposition process of depositing a trilayer of titanium silicide, titanium, and titanium nitride onto a semiconductor device, comprising the steps of (i) forming a first gaseous mixture including titanium halide and a first gas that includes silane, (ii) transforming the first mixture by chemical vapor deposition to deposit the titanium silicide film onto the semiconductor device, (iii) forming a second gaseous mixture including titanium halide and the first gas, (iv) transforming the second mixture by chemical vapor deposition to deposit the titanium film onto the semiconductor device, (v) forming a third gaseous mixture including titanium halide, ammonia, and the first gas, and (vi) transforming the third mixture by chemical vapor deposition to deposit a titanium nitride film onto the semiconductor device, thereby forming a trilayer of titanium silicide, titanium and titanium nitride.

4. A process according to claim 3 wherein the step of inducing a reaction comprises the step of utilizing plasma chemical vapor deposition.

5. A process according to claim 3 wherein the step of inducing a reaction comprises the step of utilizing thermal chemical vapor deposition.

6. A process according to claim 3 wherein the silane is selected from $SiH_4$, $Si_2H_6$ or $Si_3H_8$.

7. A process according to claim 3 wherein the titanium halide comprises $TiX_4$, where X is a halogen selected from the group consisting essentially of chlorine, bromine and iodine.

8. A process according to claim 3 comprising the further step of adding an inert gas as a carrier or plasma support gas.

9. A chemical vapor deposition process of depositing a bilayer of titanium and titanium nitride onto a semiconductor device, comprising the steps of (i) forming a first gaseous mixture including titanium halide and a first gas that includes silane, (ii) transforming the first mixture by chemical vapor deposition to deposit the titanium film onto the semiconductor device, (iii) forming a second gaseous mixture including titanium halide, ammonia, and the first gas, and (iv) transforming the second mixture by chemical vapor deposition to deposit a titanium nitride film onto the semiconductor device, thereby forming a bilayer of titanium and titanium nitride.

10. A process according to claim 9 wherein the step of inducing a reaction comprises the step of utilizing plasma chemical vapor deposition.

11. A process according to claim 9 wherein the step of inducing a reaction comprises the step of utilizing thermal chemical vapor deposition.

12. A process according to claim 9 wherein the silane is selected from $SiH_4$, $Si_2H_6$ or $Si_3H_8$.

13. A process according to claim 9 wherein the titanium halide comprises $TiX_4$, where X is a halogen selected from the group consisting essentially of chlorine, bromine and iodine.

14. A process according to claim 9 comprising the further step of adding an inert gas as a carrier or plasma support gas.

* * * * *